(12) United States Patent
Cheng et al.

(10) Patent No.: US 6,506,632 B1
(45) Date of Patent: Jan. 14, 2003

(54) METHOD OF FORMING IC PACKAGE HAVING DOWNWARD-FACING CHIP CAVITY

(75) Inventors: Jao-Chin Cheng, Hsinchu (TW); Chih-Peng Fan, Taipei Hsien (TW); David C. H. Cheng, Taoyuan Hsien (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 10/078,211

(22) Filed: Feb. 15, 2002

(51) Int. Cl.[7] .................. H01L 21/44; H01L 21/48; H01L 21/50
(52) U.S. Cl. .............. 438/126; 438/108; 438/118; 438/125; 438/127
(58) Field of Search ................ 438/108, 125, 438/126, 127

(56) References Cited

U.S. PATENT DOCUMENTS

| | | | |
|---|---|---|---|
| 4,356,374 A | * 10/1982 | Noyori et al. | 219/121.4 |
| 4,997,791 A | * 3/1991 | Ohuchi et al. | 29/832 |
| 5,882,957 A | * 3/1999 | Lin | 438/126 |
| 6,093,584 A | * 7/2000 | Fjelstad | 438/108 |
| 6,093,970 A | * 7/2000 | Ohsawa et al. | 257/668 |
| 6,399,418 B1 | * 6/2002 | Glenn et al. | 438/106 |

\* cited by examiner

Primary Examiner—David L. Talbott
Assistant Examiner—David A. Zarneke
(74) Attorney, Agent, or Firm—J.C. Patents

(57) ABSTRACT

A method of forming an integrated circuit package with a downward-facing chip cavity. A substrate comprising an insulating core layer and a conductive layer is provided. A through-hole is formed in the substrate and an adhesive tape is attached to the surface of the conductive layer. A silicon chip is attached to the exposed adhesive tape surface at the bottom of the first opening. The chip has an active surface and a back surface. The chip further includes a plurality of bonding pads on the active surface. The back surface of the chip is attached to the adhesive tape. A patterned dielectric layer is formed filling the first opening and covering a portion of the adhesive tape, the active surface, the bonding pad and the insulating core layer. The patterned dielectric layer has a plurality of openings that exposes the bonding pads and some through holes. A metallic layer is formed over the exposed surface of the openings and the upper surface of the patterned dielectric layer by electroplating. The adhesive tape is removed. The metallic layer and the conductive layer are patterned. A patterned solder resistant layer is formed over the metallic layer and the conductive layer. The patterned solder resistant layer has a plurality of openings that expose a portion of the conductive layer. A solder ball implant is conducted to form electrical connection between the solder balls and the conductive layer.

22 Claims, 9 Drawing Sheets

METHOD OF FORMING IC PACKAGE HAVING DOWNWARD-FACING CHIP CAVITY

BACKGROUND OF THE INVENTION

1. Field of Invention

The present invention relates to a method of forming an integrated circuit package having a downward-facing chip cavity. More particularly, the present invention relates to a method of forming an integrated circuit package that combines the processing of substrate board with the packaging of a silicon chip inside a downward-facing cavity.

2. Description of Related Art

As a result of rapid progress in integrated circuit (IC) fabrication techniques and expansion in applications, various types of IC package have been developed. One of the packages is ball grid array (BGA). To form a BGA package, a silicon chip is attached to a substrate and a few solder balls are planted on the substrate. The BGA package makes electrical connection with external devices through the solder balls. In general, there are two major ways of connecting a silicon chip to a substrate. The silicon chip is connected to the substrate either through bumps on a flip chip package or through bonded wires. Before attaching the silicon chip to the substrate, necessary circuit trace and connecting pads for connecting with the silicon chip must be patterned out on the substrate. However, the aforementioned types of chip-to-substrate connections produce a few problems.

To join a chip to the substrate in a flip-chip package, a layer of flux must be applied to the surface of the connecting pads and the chip package must be carefully aligned with the linking pads before applying heat to re-solder all contact points. Since re-soldering in this manner is not highly reliable, partial connection between some of the input/output contacts (bonding pads) on the chip and their corresponding connecting pads on the substrate may result. Repairing such partial contacts once they are formed is usually difficult. In addition, underfill material must be applied to fill up the space between the chip and the substrate in the process of forming the flip-chip package. The filling process demands high ingenuity because air bubbles might be entrenched inside the plastic leading to a low product yield.

On the other hand, if contacts between a silicon a chip and a substrate are provided by gold wires, wire bonding strength, connective reliability and signal delay are all problems that need to be considered. Moreover, air bubbles may be similarly trapped inside the plastic material in a subsequent molding process leading to further reliability problems.

In brief, conventional chip-to-substrate attachment processes often lead to problems regarding the reliability of connection and the trapping of air bubbles inside underfilling or molding material, thereby lowering the yield of the package.

SUMMARY OF THE INVENTION

Accordingly, one object of the present invention is to provide a method of forming an integrated circuit package having a downward-facing chip cavity capable of increasing production yield.

A second object of this invention is to provide a method of forming an integrated circuit package having a downward-facing chip cavity that ensures reliable connections between contact points on a silicon chip and corresponding connecting pads on a substrate board.

A third object of this invention is to provide a method of forming an integrated circuit package having a downward-facing chip cavity that avoids the trapping of bubbles inside underfilling and molding material.

To achieve these and other advantages and in accordance with the purpose of the invention, as embodied and broadly described herein, the invention provides a method of forming an integrated circuit package with a downward-facing chip cavity. First, a substrate comprising an insulating core layer and a conductive layer is provided. The conductive layer is formed over the lower surface of the insulating core layer. A first opening is formed in the substrate passing through both the insulating core layer and the conductive layer. An adhesive tape is attached to the surface of the conductive layer. A silicon chip is attached to the exposed adhesive tape surface at the bottom of the first opening. The chip has an active surface and a back surface. The chip further includes a plurality of bonding pads on the active surface. The back surface of the chip is attached to the adhesive tape. A patterned dielectric layer is formed filling the first opening and covering a portion of the adhesive tape, the active surface, the bonding pad and the insulating core layer. The patterned dielectric layer has a plurality of second openings and third openings. The second openings expose the bonding pads on the chip. The third openings pass through the patterned dielectric layer, the insulating core layer and the conductive layer. A metallic layer is formed over the exposed surface of the second openings and the third openings as well as the upper surface of the patterned dielectric layer by electroplating. The adhesive tape is removed to expose the conductive layer, backside of the chip and a portion of the patterned dielectric layer. The metallic layer and the conductive layer are patterned. A patterned solder resistant layer is formed over the metallic layer and the conductive layer. The patterned solder resistant layer has a plurality of fourth openings that expose a portion of the conductive layer. A solder ball implant is conducted to attach solder balls to the conductive layer so that the solder balls and corresponding sections of the conductive layer are electrically connected.

One major aspect of this invention is the combination of substrate processing and chip packaging leading to a greater fluidity in manufacturing.

A second major aspect of this invention is the formation of a patterned dielectric layer to expose the bonding pads on the chip before performing an electroplating for connecting the bonding pads and the substrate pads electrically. Hence, superior electrical contact between the chip and the substrate is formed and reliable connection between the chip and the substrate is ensured.

A third major aspect of this invention is the formation of the patterned dielectric layer before coating a layer of metal over the patterned dielectric layer by electroplating. This sequence of processing steps prevents the formation of any bubbles inside the patterned dielectric layer. Consequently, conventional problems caused by trapped bubbles inside underfilling or molding material are entirely avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
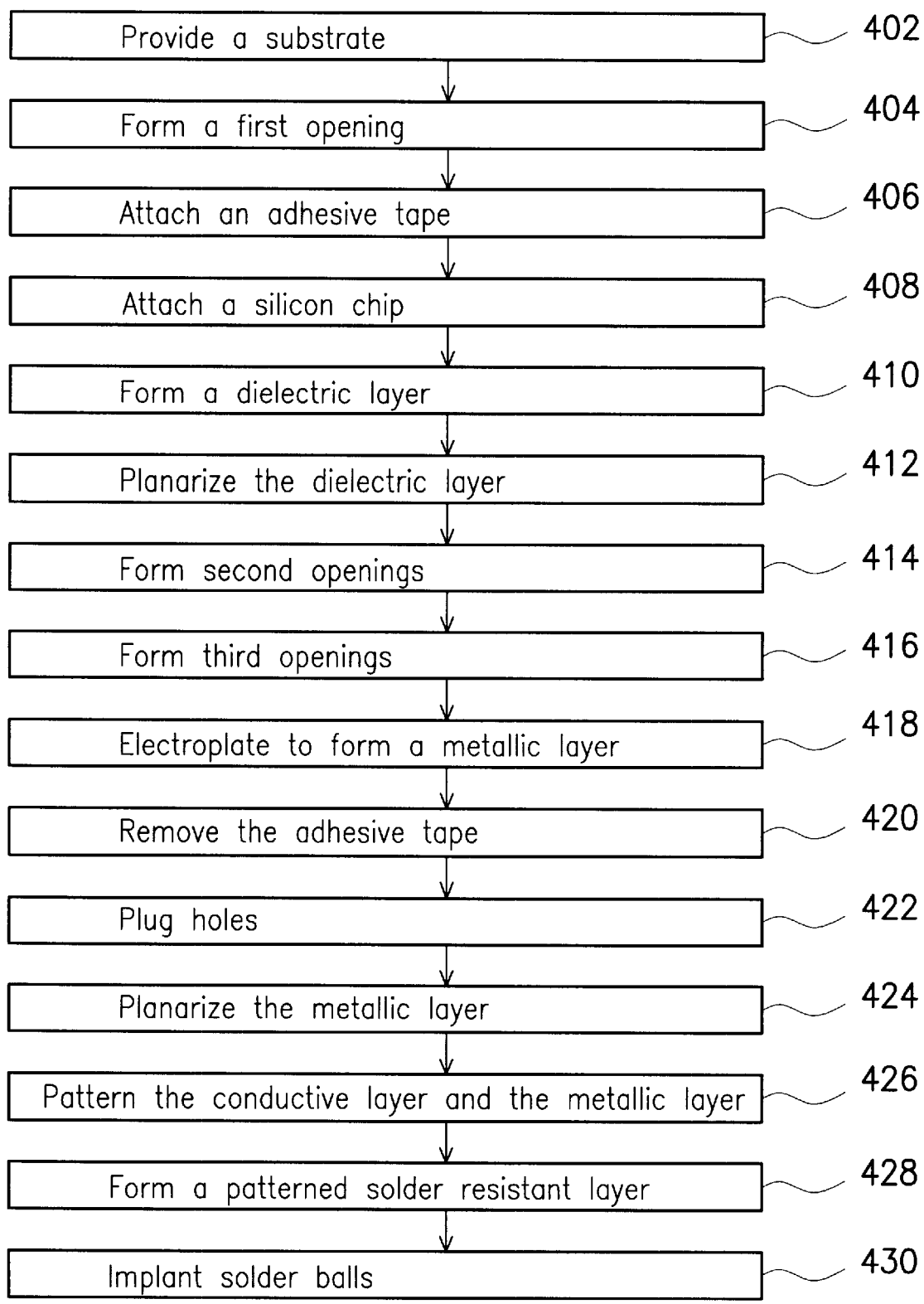
FIG. 1 is a flow chart showing the steps for producing an integrated circuit package having a downward-facing chip cavity according to a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart showing the steps for producing an integrated circuit package having a downward-facing chip cavity according to a first embodiment of this invention. FIGS. 2~16 are schematic cross-sectional views showing the progression of steps for producing an integrated circuit package with a downward-facing chip cavity according to the first embodiment of this invention.

Figure 2:
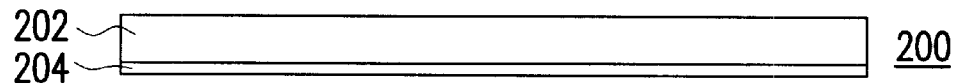
FIGS. 2~16 are schematic cross-sectional views showing the progression of steps for producing an integrated circuit package with a downward-facing chip cavity according to the first embodiment of this invention.
Figure 3:
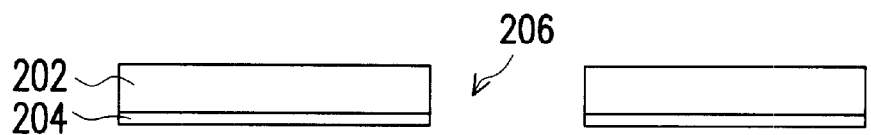

As shown in FIG. 2, a substrate 200 comprising an insulating core layer 202 and a conductive layer 204 is provided (step 401 in FIG. 1). The conductive layer 204 is formed on the lower surface of the insulating core layer 202. The conductive layer 204 can be a copper layer, for example. As shown in FIG. 3, a first opening 206 is formed in the substrate 200 (step 404 in FIG. 1). The first opening 206 passes through the insulating core layer 202 and the conductive layer 204. The first opening 206 in the substrate 200 is formed, for example, by conducting a punching operation.

Figure 4:
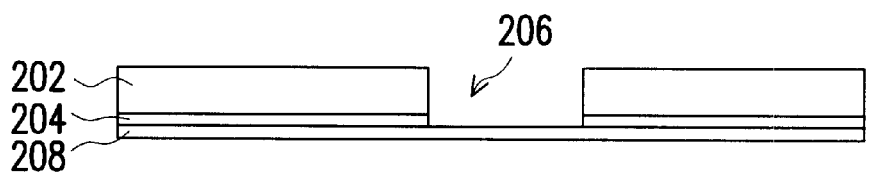
Figure 5:
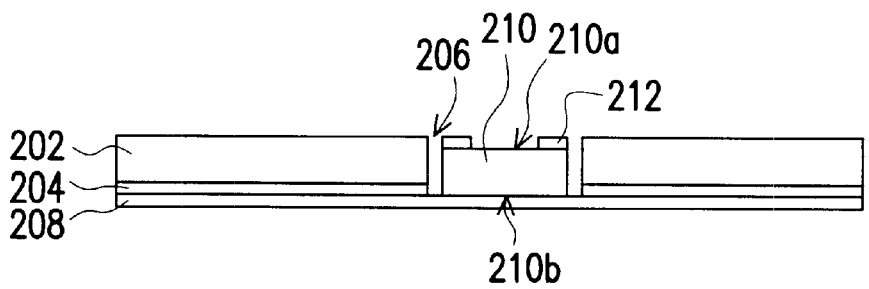

As shown in FIG. 4, an adhesive tape 208 is attached to the exposed surface of the conductive layer 204 (step 406 in FIG. 1). An upper portion of the adhesive tape is exposed through the first opening 206. As shown in FIG. 5, a silicon chip 210 is attached to the exposed upper surface of the adhesive tape 208 inside the first opening 206 (step 408 in FIG. 1). The silicon chip 210 has an active surface 210a and a backside surface 210b. The silicon chip 210 further includes a plurality of bonding pads 212 on the active surface 210a. By attaching the backside of the chip 210 onto the adhesive tape 208, the chip 200 is fixed in position.

Figure 6:
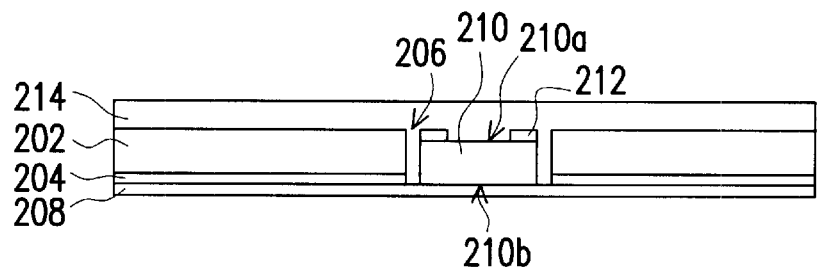
Figure 7:
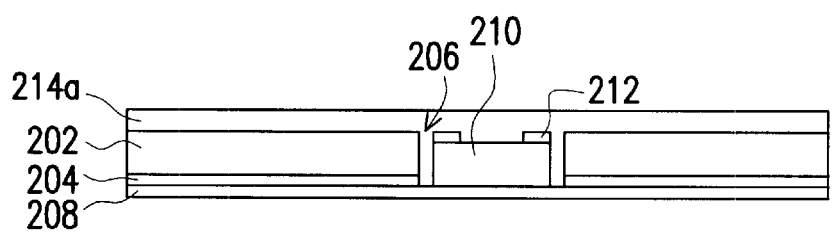

As shown in FIG. 6, a dielectric layer 214 is formed filling the first opening 206 and covering the insulating core layer 202, a portion of the adhesive tape 208 and the active surface 210a and the bonding pads 212 of the silicon chip 210 (step 410 of FIG. 1). As shown in FIG. 7, the upper surface of the dielectric layer is planarized, for example, by conducting a chemical-mechanical polishing operation to form a dielectric layer 214a (step 412 of FIG. 1).

Figure 8:
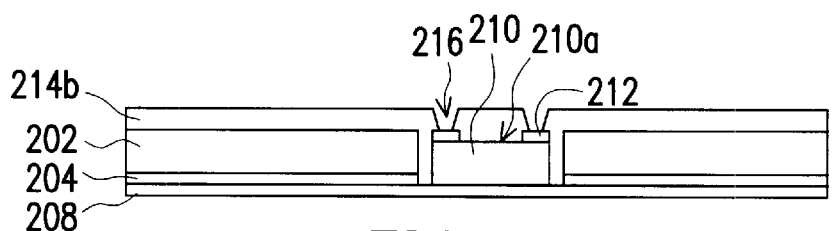
Figure 9:
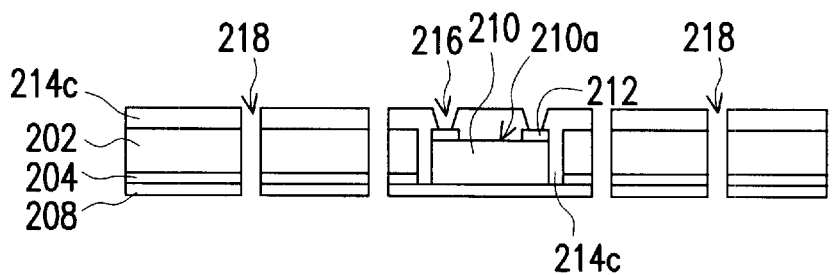

As shown in FIG. 8, a plurality of second openings 216 is formed in the dielectric layer 214a (step 414 of FIG. 1) to expose the bonding pads 212 and form a dielectric layer 214b. The second openings 216 are formed, for example, by laser drilling. Other methods, such as photolithographic and etching processes, for forming the second openings 216 are permissible. To form the second openings 216 by photolithographic and etching processes, a patterned photoresist layer (not shown) is formed over the dielectric layer and then the dielectric layer is etched using the patterned photoresist layer as a mask. As shown in FIG. 9, a plurality of third openings 218 that pass through the dielectric layer 214b, the insulating core layer 202 and the conductive layer 204 is formed (step 416 in FIG. 1). Hence, the dielectric layer 214b is patterned into a dielectric layer 214c. The third openings 218 are formed, for example, by mechanical drilling.

Figure 10:
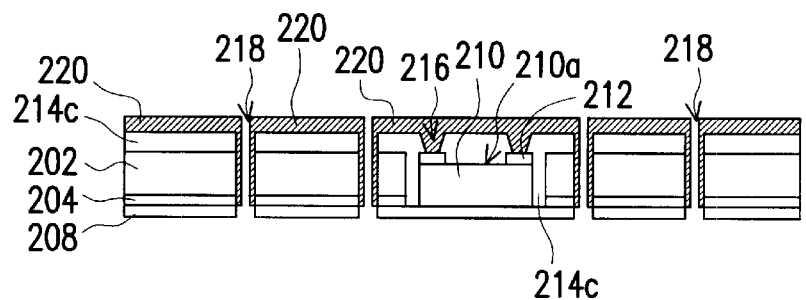
Figure 11:
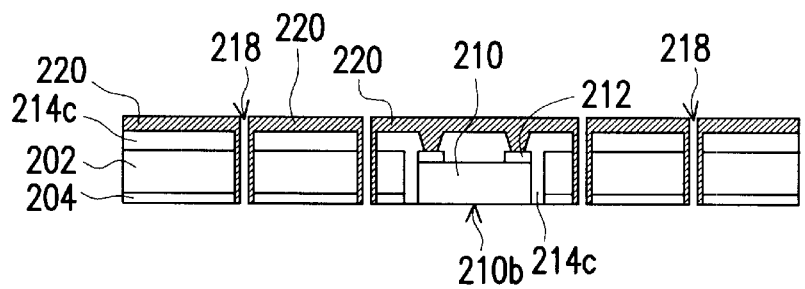

As shown in FIG. 10, a metallic layer 220 is formed over the exposed surface of the second openings 216, the third openings 218 and the patterned dielectric layer 214c (step 418 of FIG. 1) by electroplating. The metallic layer 220 is formed, for example, by conducting an electroless plating operation to form a thin metallic film over the exposed surface of the second openings, the third openings and the patterned dielectric layer and then conducting an electroplating operation using the metallic film as a seeding layer. As shown in FIG. 11, the adhesive tape 208 is removed to expose the conductive layer 204, the backside of the silicon chip 210 and a portion of the patterned dielectric layer 214c.

Figure 12:
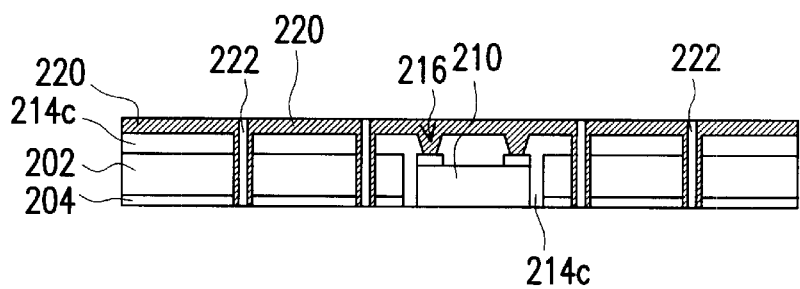
Figure 13:
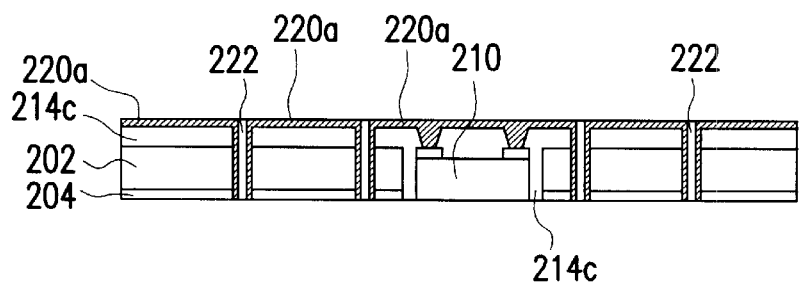

As shown in FIG. 12, a plugging operation is carried out to fill up the third openings 218 with a plugging compound 222 (step 422 of FIG. 1). As shown in FIG. 13, the metallic layer 220 is planarized, for example, by conducting a chemical-mechanical polishing operation to form a metallic layer 220a (step 424 of FIG. 1).

Figure 14:
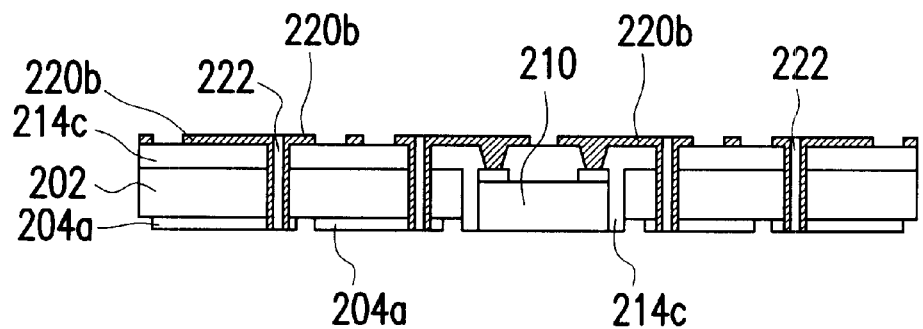
Figure 15:
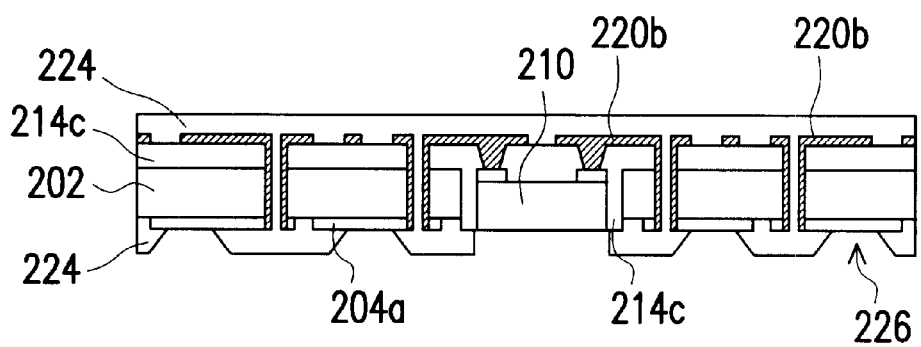

As shown in FIG. 14, the metallic layer 220a and the conductive layer 204 are patterned to form a patterned metallic layer 220b and a patterned conductive layer 204a (step 426 in FIG. 1). As shown in FIG. 15, a solder resistant layer 224 is formed over the patterned metallic layer 220b and the patterned conductive layer 204a. The patterned solder resistant layer 224 has a plurality of fourth openings 226 that expose a portion of the patterned conductive layer 204a.

Figure 16:
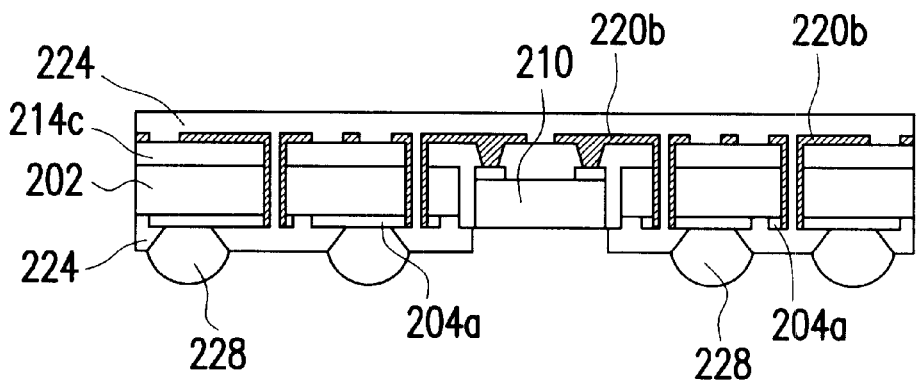

Finally, as shown in FIG. 16, a ball implantation (step 430 in FIG. 1) is carried out planting a solder ball 228 over each fourth opening 226 and heating (a solder reflow step) to form an electrical connection between the solder balls 228 and the patterned conductive layer 204a.

In the aforementioned first embodiment of this invention, the attachment of an adhesive tape over the conductive layer serves to fix the position of the silicon chip. Another way to fix the position of the silicon chip is to form a blind hole without penetrating the conductive layer rather than the first opening that penetrates the conductive layer. The silicon chip is then attached to the upper surface of the conductive layer inside the blind hole.

FIGS. 17~29 are schematic cross-sectional views showing the progression of steps for producing an integrated circuit package with a downward-facing chip cavity according to the second embodiment of this invention.

Figure 17:
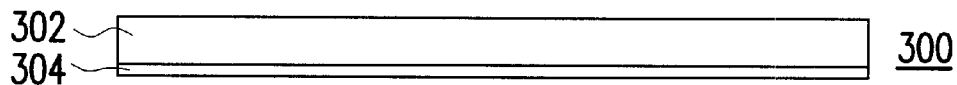
FIGS. 17~29 are schematic cross-sectional views showing the progression of steps for producing an integrated circuit package with a downward-facing chip cavity according to the second embodiment of this invention.
Figure 18:
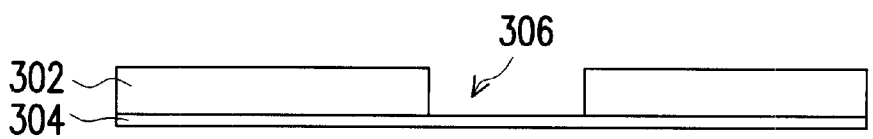

As shown in FIG. 17, a substrate 300 comprising an insulating core layer 302 and a conductive layer 304 is provided. The conductive layer 304 is formed on the lower surface of the insulating core layer 302. The conductive layer 304 can be a copper layer, for example. As shown in FIG. 18, a first opening 306 is formed in the substrate 300. The first opening 306 passes through the insulating core layer 302 exposing a portion of the conductive layer 304. The first opening 306 in the substrate 300 is formed, for example, by mechanical drilling.

Figure 19:
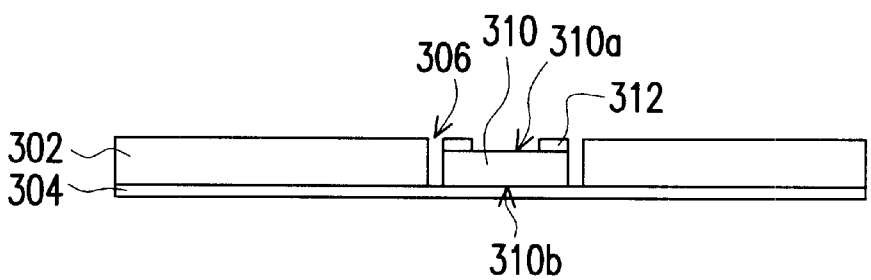

As shown in FIG. 19, a silicon chip 310 is attached to the upper surface of the conductive layer 304 inside the first opening 306. The silicon chip 310 has an active surface 310a and a backside surface 310b. The silicon chip 310 further includes a plurality of bonding pads 312 on the active surface 310a. By attaching the backside of the chip 310 to the conductive layer 304, the chip 300 is fixed in position.

Figure 20:
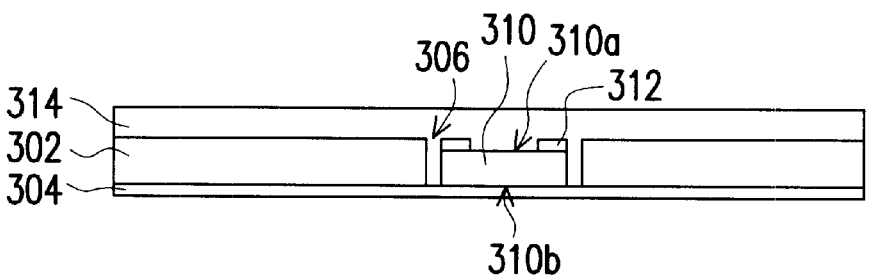
Figure 21:
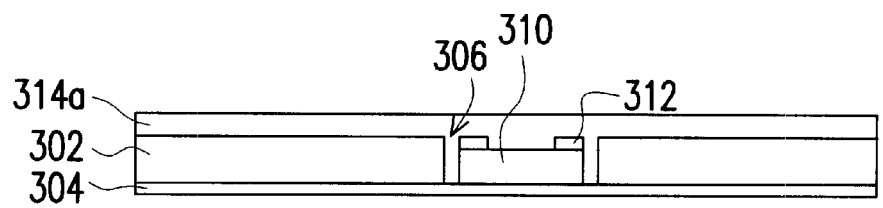

As shown in FIG. 20, a dielectric layer 314 is formed filling the first opening 306 and covering the insulating core layer 302, a portion of the conductive layer 304 and the active surface 310a and the bonding pads 312 of the silicon chip 310. As shown in FIG. 21, the upper surface of the dielectric layer is planarized, for example, by conducting a chemical-mechanical polishing operation to form a dielectric layer 314a.

Figure 22:
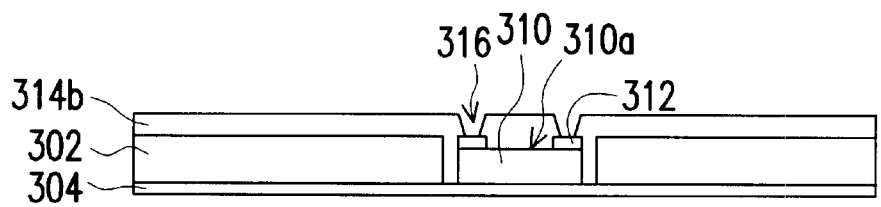
Figure 23:
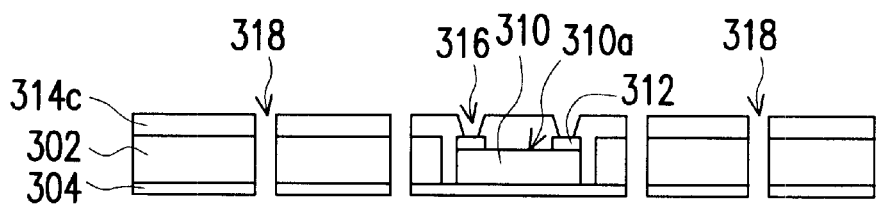

As shown in FIG. 22, a plurality of second openings 316 is formed in the dielectric layer 314a to expose the bonding pads 312 and form a dielectric layer 314b. The second openings 316 are formed, for example, by laser drilling. Other methods, such as photolithographic and etching processes, for forming the second openings 316 are permissible. To form the second openings 316 by photolithographic and etching processes, a patterned photoresist layer (not shown) is formed over the dielectric layer and then the dielectric layer is etched using the patterned photoresist layer as a mask. As shown in FIG. 23, a plurality of third openings 318 that pass through the dielectric layer 314b, the insulating core layer 302 and the conductive layer 304 is formed. Hence, the dielectric layer 314b is patterned into a dielectric layer 314c. The third openings 318 are formed, for example, by mechanical drilling.

Figure 24:
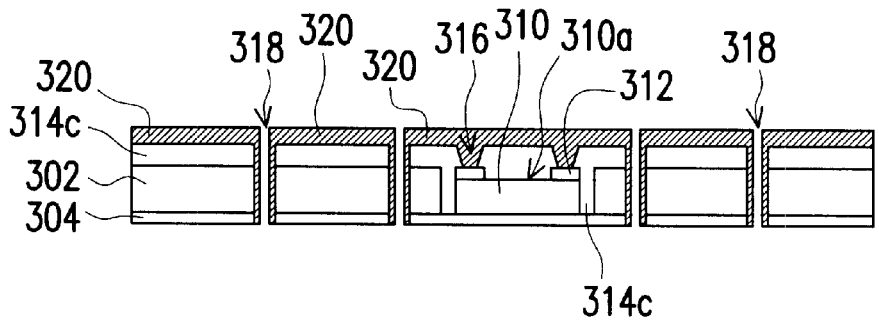

As shown in FIG. 24, a metallic layer 320 is formed over the exposed surface of the second openings 316, the third openings 318 and the patterned dielectric layer 314c by electroplating. The metallic layer 320 is formed, for example, by conducting an electroless plating operation to form a thin metallic film over the exposed surface of the second openings, the third openings and the patterned dielectric layer and then conducting an electroplating operation using the metallic film as a seeding layer.

Figure 25:
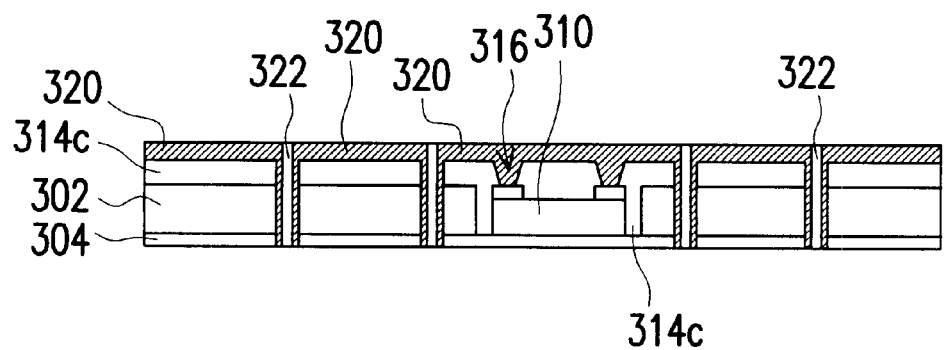
Figure 26:
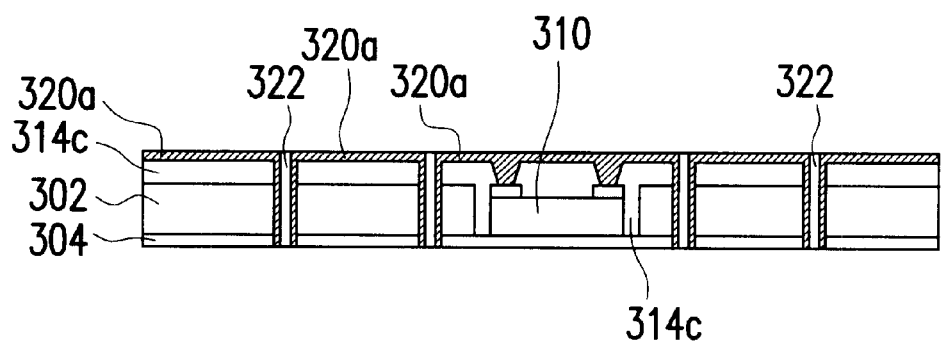

As shown in FIG. 25, a plugging operation is carried out to fill up the third openings 318 with a plugging compound 322. As shown in FIG. 26, the metallic layer 320 is planarized, for example, by conducting a chemical-mechanical polishing operation to form a metallic layer 320a.

Figure 27:
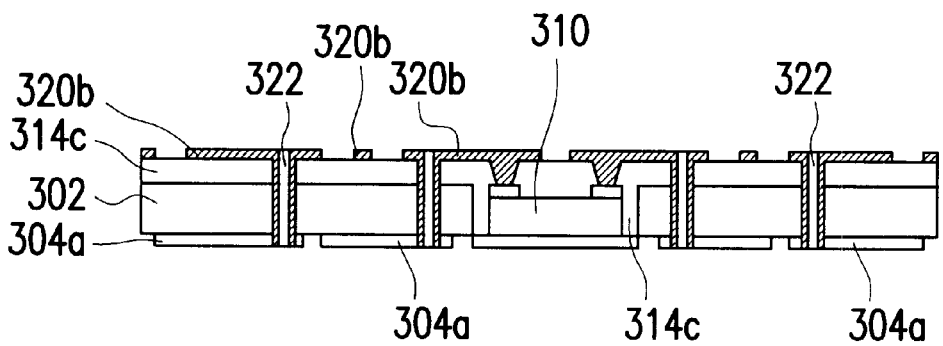
Figure 28:
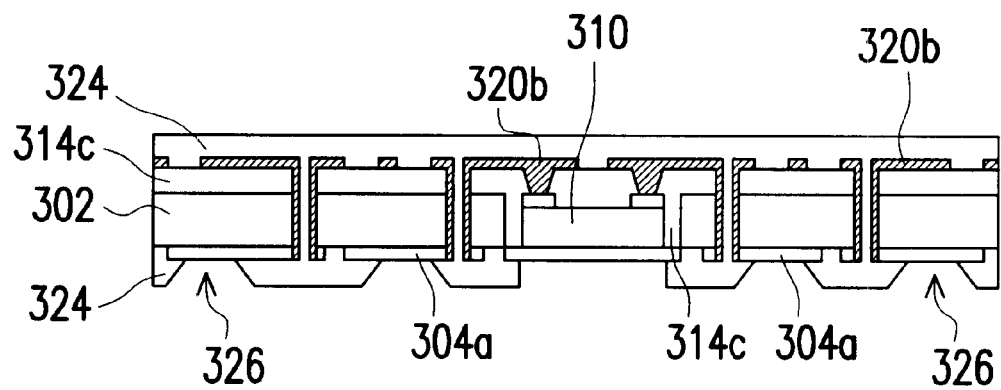

As shown in FIG. 27, the metallic layer 320a and the conductive layer 304 are patterned to form a patterned metallic layer 320b and a patterned conductive layer 304a. As shown in FIG. 28, a solder resistant layer 324 is formed over the patterned metallic layer 320b and the patterned conductive layer 304a. The patterned solder resistant layer 324 has a plurality of fourth openings 326 that expose a portion of the patterned conductive layer 304a.

Figure 29:
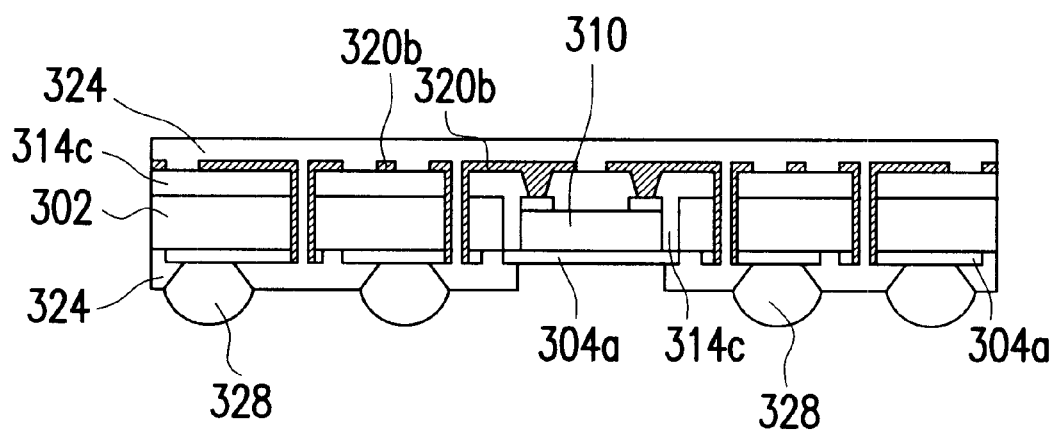

Finally, as shown in FIG. 29, a ball implantation is carried out planting a solder ball 328 over each fourth opening 326 and heating (a solder reflow step) to form an electrical connection between the solder balls 328 and the patterned conductive layer 304a.

One major aspect of this invention is the combination of substrate processing and chip packaging leading to a greater fluidity in manufacturing.

A second major aspect of this invention is the formation of a patterned dielectric layer to expose the bonding pads on the chip before performing an electroplating for connecting the bonding pads and the substrate pads electrically. Hence, compared with the connection between the bumps and substrate in a conventional flip-chip package, superior electrical contact between the chip and the substrate is formed and reliable connection between the chip and the substrate is ensured.

A third major aspect of this invention is the formation of the patterned dielectric layer before coating a layer of metal over the patterned dielectric layer by electroplating. This sequence of processing steps prevents the formation of any bubbles inside the patterned dielectric layer. Consequently, problems caused by trapped bubbles inside underfilling or molding material are entirely avoided.

In this invention, the silicon chip is attached to the substrate before processing steps including the patterning of the dielectric layer and the forming of a metallic layer by electroplating necessary for connecting the substrate and the chip electrically are carried out. Thereafter, the metallic layer and the conductive layer are patterned to form electrical trace lines in the substrate. Since the precision in each subsequent step is gradually relaxed, product yield is increased. The connection between the silicon chip and the substrate in a conventional method, on the other hand, is conducted only after the substrate trace lines and connective pad pattern are formed. Because the silicon chip demands high precision (front-end section of semiconductor manufacturing) while the substrate demands a lower precision (relative to the front-end section), connecting the silicon chip (high precision) to the substrate (low precision) after the substrate is manufactured requires an increase in precision (to match with the chip). Hence, product yield is often difficult to control.

In conclusion, major advantages of this invention includes:

1. The IC package method assimilates the fabrication of the substrate with packaging the chip so that manufacturing flow is smoother and more flexible.

2. By forming the patterned dielectric layer to expose bonding pads on a silicon chip before conducting an electroplating to connect the bonding pads with corresponding contacts on the substrate, reliable connection between the chip and the substrate is ensured.

3. Similar to above, problems caused by bubbles trapping inside underfilling material or molding compound is entirely avoided.

4. Compared with a conventional method of joining the chip and the substrate, the steps for forming the package is gradually relaxed so that product yield is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming an integrated circuit package having a downward facing chip cavity, comprising the steps of:

providing a substrate consisting of an insulating core layer and a conductive layer, wherein the conductive layer is attached to the lower surface of the insulating core layer;

forming a first opening in the substrate such that the first opening penetrates the insulating core layer and the conductive layer;

attaching an adhesive tape over the conductive layer so that the first opening exposes a portion of the upper surface of the adhesive tape;

attaching a silicon chip to the exposed adhesive tape inside the first opening, wherein the silicon chip has an active surface and a backside surface, the active surface further includes a plurality of bonding pads while the backside of the silicon chip adheres to the adhesive tape so that the chip is fixed in position;

forming a patterned dielectric layer that fills the first opening and covers a portion of the adhesive tape, the active surface, the bonding pads of the silicon chip and the insulating core layer, wherein the patterned dielectric layer further includes a plurality of second openings and a plurality of third openings, the second openings expose the bonding pads and the third openings pass through the patterned dielectric layer, the insulating core layer and the conductive layer;

conducting an electroplating operation to form a metallic layer over the exposed surface of the second openings, the third openings and the patterned dielectric layer;

patterning the metallic layer and the conductive layer to form a patterned metallic layer and a patterned conductive layer respectively;

forming a patterned solder resistant layer over the patterned metallic layer and the patterned conductive layer, wherein the patterned solder resistant layer has a plurality of fourth openings that expose a portion of the patterned conductive layer; and planting a solder ball on each fourth opening and heating the solder ball to form electrical contact between the solder ball and the patterned conductive layer.

2. The method of claim 1, wherein the step of forming the first opening includes punching.

3. The method of claim 1, wherein before the step of patterning the metallic layer and the conductive layer, further includes filling the third openings with a plugging compound.

4. The method of claim 1, wherein before the step of patterning the metallic layer and the conductive layer, further includes planarizing the metallic layer.

5. The method of claim 4, wherein the step of planarizing the metallic layer includes chemical-mechanical polishing.

6. The method of claim 1, wherein the step of patterning the dielectric layer further includes:

forming a dielectric layer that fills the first opening and covers the insulating core layer, a portion of the adhesive tape and the active surface and bonding pad of the silicon chip;

forming the second openings in the dielectric layer to expose the bonding pads; and forming the third openings that pass through the dielectric layer, the insulating core layer and the conductive layer.

7. The method of claim 6, wherein the step for forming the second openings includes laser drilling.

8. The method of claim 6, wherein the step for forming the second openings includes:

forming a patterned photoresist layer over the dielectric layer; and etching the dielectric layer using the patterned photoresist layer as mask until the bonding pads are exposed.

9. The method of claim 6, wherein the step for forming the third openings include mechanical drilling.

10. The method of claim 6, wherein before the step of forming the second openings, further includes planarizing the dielectric layer.

11. The method of claim 10, wherein the step of planarizing the dielectric layer includes chemical-mechanical polishing.

12. A method of forming an integrated circuit package having a downward facing chip cavity, comprising the steps of:

providing a substrate consisting of an insulating core layer and a conductive layer, wherein the conductive layer is attached to the lower surface of the insulating core layer;

forming a first opening in the substrate such that the first opening penetrates the insulating core layer and exposes a portion of the conductive layer;

attaching a silicon chip to the exposed conductive layer inside the first opening, wherein the silicon chip has an active surface and a backside surface, the active surface further includes a plurality of bonding pads while the backside of the silicon chip adheres to the conductive layer so that the chip is fixed in position;

forming a patterned dielectric layer that fills the first opening and covers a portion of the conductive layer, the active surface, the bonding pads of the silicon chip and the insulating core layer, wherein the patterned dielectric layer further includes a plurality of second openings and a plurality of third openings, the second openings expose the bonding pads and the third openings pass through the patterned dielectric layer, the insulating core layer and the conductive layer;

conducting an electroplating operation to form a metallic layer over the exposed surface of the second openings, the third openings and the patterned dielectric layer;

patterning the metallic layer and the conductive layer to form a patterned metallic layer and a patterned conductive layer respectively;

forming a patterned solder resistant layer over the patterned metallic layer and the patterned conductive layer, wherein the patterned solder resistant layer has a plurality of fourth openings that expose a portion of the patterned conductive layer; and planting a solder ball on each fourth opening and heating the solder ball to form electrical contact between the solder ball and the patterned conductive layer.

13. The method of claim 12, wherein the step of forming the first opening includes mechanical drilling.

14. The method of claim 12, wherein before the step of patterning the metallic layer and the conductive layer, further includes filling the third openings with a plugging compound.

15. The method of claim 12, wherein before the step of patterning the metallic layer and the conductive layer, further includes planarizing the metallic layer.

16. The method of claim 15, wherein the step of planarizing the metallic layer includes chemical-mechanical polishing.

17. The method of claim 12, wherein the step of patterning the dielectric layer further includes:

forming a dielectric layer that fills the first opening and covers the insulating core layer, a portion of the adhesive tape and the active surface and bonding pad of the silicon chip;

forming the second openings in the dielectric layer to expose the bonding pads; and forming the third openings that pass through the dielectric layer, the insulating core layer and the conductive layer.

18. The method of claim 17, wherein the step for forming the second openings includes laser drilling.

19. The method of claim 17, wherein the step for forming the second openings includes:

forming a patterned photoresist layer over the dielectric layer; and etching the dielectric layer using the patterned photoresist layer as mask until the bonding pads are exposed.

20. The method of claim 17, wherein the step for forming the third openings include mechanical drilling.

21. The method of claim 17, wherein before the step of forming the second openings, further includes planarizing the dielectric layer.

22. The method of claim 21, wherein the step of planarizing the dielectric layer includes chemical-mechanical polishing.

* * * * *